United States Patent [19]

Lohaus et al.

[11] Patent Number: 5,230,985
[45] Date of Patent: Jul. 27, 1993

[54] NEGATIVE-WORKING RADIATION-SENSITIVE MIXTURES, AND RADIATION-SENSITIVE RECORDING MATERIAL PRODUCED WITH THESE MIXTURES

[75] Inventors: Gerhard Lohaus, Kelkheim; Walter Spiess, Dieburg; Georg Pawlowski, Wiesbaden, all of Fed. Rep. of Germany

[73] Assignee: Hoechst Aktiengesellschaft, Frankfurt am Main, Fed. Rep. of Germany

[21] Appl. No.: 871,007

[22] Filed: Apr. 20, 1992

[30] Foreign Application Priority Data

Apr. 20, 1991 [DE] Fed. Rep. of Germany ....... 4112965

[51] Int. Cl.⁵ .................. G03F 7/038; G03F 7/30
[52] U.S. Cl. ..................... 430/280; 430/270; 430/281; 430/325; 522/50
[58] Field of Search ............... 430/270, 281, 326, 330, 430/325; 522/50

[56] References Cited

U.S. PATENT DOCUMENTS

| 3,692,560 | 9/1972 | Jürgen et al. | 117/93.31 |
| 4,376,818 | 3/1983 | Ohashi et al. | 430/623 |
| 4,840,867 | 6/1989 | Elsaesser et al. | 430/156 |

FOREIGN PATENT DOCUMENTS

| 0164248 | 12/1985 | European Pat. Off. . |
| 0232972 | 8/1987 | European Pat. Off. . |
| 0302019 | 2/1989 | European Pat. Off. . |

OTHER PUBLICATIONS

Houlihan, "An Evaluation of Nitrobenzyl Ester Chemistry for Chemical Amplification Resists", SPIE, vol. 920, *Advances in Resist Technology and Processing*, 1988, pp. 67-73.

Crivello, "Possibilities for Photoimaging Using Onium Salts", *Polymer Engineering and Science, Mid-December*, 1983, vol. 23, pp. 953-956.

Willson, "Organic Resist Materials—Theory and Chemistry", *Introduction to Microlithography*, 1983.

*Primary Examiner*—Cynthia Hamilton
*Attorney, Agent, or Firm*—Foley & Lardner

[57] ABSTRACT

A negative-working radiation-sensitive mixture containing
a) a compound which generates a strong acid under the action of actinic radiation, comprising a 1-sulfonyloxy-2-pyridone,
b) a compound having at least two groups crosslinkable by acid and
c) a polymeric binder which is insoluble in water and soluble or at least swellable in aqueous alkaline solutions.

20 Claims, No Drawings

NEGATIVE-WORKING RADIATION-SENSITIVE MIXTURES, AND RADIATION-SENSITIVE RECORDING MATERIAL PRODUCED WITH THESE MIXTURES

BACKGROUND OF THE INVENTION

1. Field of the Invention

The invention relates to a negative-working radiation-sensitive mixture containing
  a) a compound which generates a strong acid under the action of actinic radiation,
  b) a compound having at least two groups crosslinkable by acid and
  c) a polymeric binder which is insoluble in water and soluble or at least swellable in aqueous alkaline solutions.

The invention also relates to a radiation-sensitive recording material produced with this mixture which is suitable for producing photoresists, electronic components, printing plates or for chemical milling.

2. Description of Related Art

To produce microelectronic circuits, several lithographic techniques are currently being used. Using g-line lithography (436 nm), which is usually applied to conventional diazonaphthoquinone/novolak formulations, resist images with a resolution of down to 0.8 μm can be produced. Images of even finer structures (down to 0.5 μm) on a resist layer can be obtained by means of i-line lithography (365 nm). More recent modifications of i-line lithography, such as, for example, phase-shifting mask technology, allow a further reduction in the size of the structures, of which images are to be formed, right down to about 0.35 μm or less. An even higher resolution can be achieved with UV2 photoresists. In this case, two irradiation techniques are used: UV2 wide band exposure (240 to 260 nm) or exposure with KrF-excimer lasers which emit at 248 nm.

The continuing reduction in the size of the structures, for example in chip manufacture down into the range of less than 1 μm, requires modified lithographic techniques. To form images of such fine structures, radiation of a short wavelength is used, such as high-energy UV light, electron beams and x-rays. The radiation-sensitive mixture must be adapted to the short wave radiation. A compilation of the requirements to be met by the radiation-sensitive mixture is given in the article by C. G. Willson "Organic Resist Materials—Theory and Chemistry" [Introduction to Microlithography, Theory, Materials, and Processing, editors L. F. Thompson, C. G. Willson, M. J. Bowden, ACS Symp. Ser., 219, 87 (1983), American Chemical Society, Washington].

There is therefore an increased demand for radiation-sensitive mixtures which can be used in the more recent technologies, such as mid-UV or deep-UV lithography [exposure, for example, with excimer lasers at wavelengths of 305 nm (Xef), 248 nm (KrF), 193 nm (ArF)], electron beam lithography or x-ray lithography, and which, furthermore, are preferably sensitive in a wide spectral region and correspondingly can also be used in conventional UV lithography.

Negative-working radiation-sensitive mixtures which contain bisazides as crosslinking agents and binders derived from isoprene are known. They are used as radiation-sensitive layers in the production of printing plates, printed circuits and integrated circuits. Their use in microlithography is, however, restricted by various technical disadvantages. Thus, it is difficult to produce qualitatively high-grade layers without pinholes. The heat holdout of such mixtures is inadequate, i.e., the resist images are distorted by thermal flow during processing. Finally, their resolution capacity is restricted to structures of >2 μm since, during the necessary development with organic solvents, they show undesirably high swelling even in the hardened areas, which in turn causes structure distortions or inhomogeneous developing processes and hence inadequate reproduction of the image predetermined by the exposure mask.

To be able to produce resist images having a resolution of better than 2 μm, other negative-working radiation-sensitive mixtures have been developed which are sensitive to radiation of shorter wavelength, for example to high-energy UV radiation, electron beams or X-rays. Such a mixture contains, for example, a copolymer of 2,3-epoxypropyl methacrylate and 2,3-dichloropropyl methacrylate (DCOPA) or a combination of the corresponding homopolymers. The glass transition temperature of this mixture is, however, too low for many applications and, in particular, the low resistance of the mixture to plasma etching is undesirable. Furthermore, this resist material must be processed using developers based on organic solvents which are rather prone to pollute the environment. However, other hitherto known negative-working, aliphatically based photoresists also show a low resistance to plasma etching.

In EP-A 0,164,248, an acid-curable mixture was described which can be developed in aqueous alkaline media, has an improved plasma-etching resistance due to the use of aromatics and is sensitive to near UV light (350 to 450 nm). The acid generators mentioned here are especially sulfonic acid ester derivatives of diazonaphthoquinone, which form weakly acidic carboxylic acids on exposure and are therefore effective only in a comparatively high concentration. Due to the weak absorptions and the inadequate bleaching properties of the photolytic acid generator, however, such mixtures have a low sensitivity to DUV radiation, electron beams and x-rays.

In U.S. Pat. No. 3,692,560, an acid-curable mixture is described which contains an acid-crosslinkable melamine derivative, a novolak and chlorinated benzophenones as photolytic acid generators. These mixtures again do not have an adequate sensitivity in the deep UV region. Furthermore, hydrohalic acids are undesired as crosslinking catalysts, since these can, during the subsequent doping processes, undergo reactions with the dopants. Moreover, hydrohalic acids remaining in the cured resist have a strong corrosive action and can cause destruction of the material to be imaged and of the production equipment.

The same applies to the acid-generating derivatives of DDT, mentioned in EP 0,232,972, which are highly toxic and, if only for this reason, cannot be suitable for practice. Nevertheless, such compounds show a considerable sensitivity in the deep UV region (200 to 300 nm).

As the compounds which generate a strong acid on irradiation, especially onium salts, such as diazonium, phosphonium, sulfonium and iodonium salts of nonnucleophilic acids such as $HSbF_6$, $HAsF_6$ or $HPF_6$ [see J. V. Crivello, Polym. Eng. Sci., 23 (1983) 953] have hitherto been used. In addition, halogen compounds, especially trichloromethyltriazine derivatives, trichloromethyloxadiazole derivatives, o-quinonediazidesulfonyl chlorides and o-quinonediazide-4-sulfonic acid esters have been recommended.

These compounds are used in negative- or positive-working radiation-sensitive mixtures. The use of such photolytic acid generators involves, however, disadvantages which drastically restrict the possible uses thereof in various fields of application. For example, many of the onium salts are toxic. Their solubility is inadequate in many solvents, which is why only a few solvents are suitable for preparing a coating solution. Furthermore, when the onium salts are used, undesired foreign atoms are sometimes introduced which can cause interference with the process, especially in microlithography. Moreover, the onium salts form Brönstedt acids, which have a very severe corrosive action, in the photolysis. These acids attack sensitive substrates, so that the use of such mixtures leads to unsatisfactory results. The halogen compounds and also the quinonediazidesulfonic acid chlorides also form hydrohalic acids which have a severely corrosive action. In addition, such compounds also have only a limited storage life on certain substrates. This was improved by inserting an interlayer between the substrate and the radiation-sensitive layer containing compounds of the type (a), but this led to an undesired increase in defects and to diminished reproducibility (see DE-A 3,621,376 equivalent to U.S. Pat. No. 4,840,867).

In more recent papers by F. M. Houlihan et al., SPIE 920, 67 (1988), it was shown by reference to positive-working systems that, in addition to the above-mentioned acid generators, nitrobenzyl tosylates, which on exposure generate sulfonic acids having a low migration tendency, can also be used in certain acid-unstable resist formulations. It can be deduced from these results that such compounds can also be used for photo-curable systems. However, the sensitivities achieved with these compounds, especially to UV radiation from 350 to 450 nm, and the thermal stability of the photoresists have proven to be inadequate.

In the U.S. Ser. No. 07/661,328, filed Feb. 27, 1991, $\alpha,\alpha$-bis-sulfonyl- or $\alpha$-carbonyl-$\alpha$-sulfonyldiazomethanes have been proposed as acid generators. These compounds represent an advanced state of the prior art but frequently exhibit a not entirely satisfactory thermal stability.

In spite of the intensive research activity so far carried out in this field, no radiation-sensitive mixture is at present known, by means of which a negative-working radiation-sensitive recording material can be prepared which has a high sensitivity both in the deep UV region [DUV (200 to 300 nm)] and also in the mid-UV region [MUV (300 to 350 nm)] and near-UV region [NUV (350 to 450 nm)] and high resolution, and which, even on brief irradiation, releases a sufficient quantity of an acid which does not have a corrosive action and which is sufficiently strong for cleaving compounds of type b) and, in addition, can also be developed in aqueous alkaline media.

SUMMARY OF THE INVENTION

It is therefore an object of the invention to propose a radiation-sensitive mixture based on acid-generating compounds in combination with compounds crosslinkable by acid, wherein the compound photolytically generating an acid should be as stable as possible on all known substrates and, as the photoproduct, gives an acid not having a corrosive action.

It is further an object of the present invention to provide a negative-working recording material which provides a defect-free image of the mask having high flank stability, and which is suitable for use in the production of photoresists, electronic components, and printing plates.

It is also an object of the present invention to provide a process for producing such a recording material.

It is also an object of the present invention to provide a method of preparing an image pattern using the recording material.

In accomplishing the foregoing objectives, there has been provided, in accordance with one aspect of the present invention, a negative-working radiation-sensitive mixture comprising a) at least one compound which generates a strong acid under the action of actinic radiation,
b) at least one compound having at least two groups crosslinkable by acid and
c) at least one polymeric binder which is insoluble in water and soluble or at least swellable in aqueous alkaline solutions, wherein the compound a) comprises a 1-sulfonyloxy-2-pyridone of the formula (I)

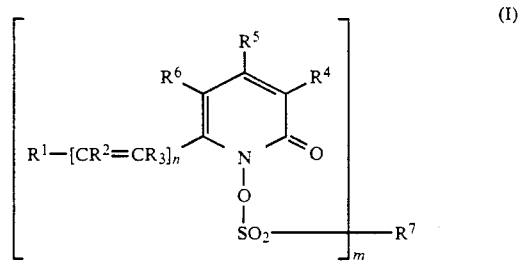

in which
$R^1$ is a hydrogen atom or an alkyl, cycloalkyl, aryl, aralkenyl, heteroaryl or heteroaralkenyl radical,
$R^2$ is hydrogen, chlorine, bromine or an alkyl, cycloalkyl, aryl or heteroaryl radical, or
$R^1$ and $R^2$ together form a five- to eight-membered ring,
$R^3$ is hydrogen or an alkyl radical,
$R^4$ is hydrogen, halogen, nitro, acylamino, cyano, thiocyanato or an alkyl, alkenyl, alkynyl, aryl, aralkyl, alkylthio, arylthio or cycloalkylthio radical,
$R^5$ is hydrogen or an alkyl or aryl radical or
$R^4$ and $R^5$ together form a five- to eight-membered ring,
$R^6$ is hydrogen halogen nitro, acylamino, cyano, thiocyanato or an alkyl, alkenyl, alkoxyalkyl, aryl, aralkyl, alkylthio, cycloalkylthio or arylthio radical,
$R^7$ is an alkyl or cycloalkyl radical, a perfluorinated or highly fluorinated alkyl radical or an aryl, arylalkyl or heteroaryl radical or an alkylene or arylene radical,
m is 1 or 2, and
n is 0, 1, 2 or 3.

When m or n or both are greater than 1, the groups R in the repeating units may be the same or different.

An alkyl radical is designated as "highly fluorinated" when at least 50 % of the alkyl hydrogen atoms are replaced by fluorine atoms.

There has further been provided a negative-working radiation sensitive recording material comprising a support and a radiation-sensitive layer, wherein the layer comprises a radiation-curable mixture as described above.

There has also been provided a method of producing such a recording material comprises dissolving the radiation sensitive mixture in a solvent, and applying the resultant solution to the support and removing the solvent.

There has further been provided a method of preparing an image pattern comprising irradiating the radiation-sensitive layer imagewise, optionally heating the irradiated layer, treating the layer with a developer which removes the unexposed (un-irradiated) areas of the layer, and optionally post-hardening the developed layer structures.

Further objects, features, and advantages of the present invention will become apparent from the detailed description of preferred embodiments that follows.

DETAILED DESCRIPTION OF PREFERRED EMBODIMENTS

Under the action of actinic radiation, the compounds comprising a) form reactive intermediates which are capable of initiating specific chemical reactions, for example free-radical polymerizations. When irradiated, they generate organic acids which catalyze reactions, such as cationic polymerizations, crosslinking reactions or cleavage of acid-unstable compounds or can react with bases, which can manifest itself, for example, in a color change of indicator dyes. Those compounds of the formula I are preferred in which $R^1$ is an alkyl or cycloalkyl radical or an aryl radical of the formula II

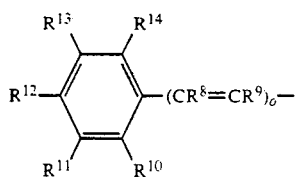

in which
- $R^8$ and $R^9$ are identical or different and are hydrogen or an alkyl preferably having 1 to 6 carbon atoms or an aryl group,
- $R^{10}$ to $R^{14}$ are identical or different and are hydrogen, an alkyl, alkenyl, alkoxy, alkylthio or alkanesulfonyl radical each having up to 6 carbon atoms, a cycloalkyloxy, cycloalkylthio or cycloalkanesulfonyl radical each having up to 8 carbon atoms, a phenyl, styryl, phenoxy, phenylthio, benzenesulfonyl, phenylalkoxy, phenylalkylthio or phenylalkanesulfonyl radical which may be substituted on the aromatic ring and has up to 3 carbon atoms in the alkyl chain, hydroxyl, halogen, trifluoromethyl, nitro, cyano, alkoxycarbonyl, carbamoyl which may be substituted on the nitrogen by one or two alkyl radical(s) which may be linked to form a 5- to 7-membered ring, sulfamoyl which may be substituted on the nitrogen by one or two alkyl radical(s) which may be linked to form a 5- to 7-membered ring, alkanesulfonyloxy, arylsulfonyloxy, aylamino, alkylamino or arylamino, or two mutually adjacent substituents $R^{10}$ to $R^{14}$ form one or two further fused ring(s), and
- o is 0 or 1.

In addition, those compounds of the formula I are also preferred in which $R^1$ is a 5- or 6-membered heterocyclic ring having up to three heteroatoms, of the formula III

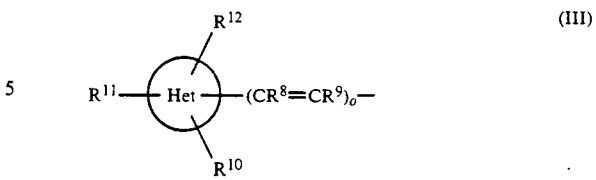

Finally, those compounds of the formula I are also preferred
in which
- $R^1$ is a ferrocenyl radical,
- $R^2$ is hydrogen, chlorine, bromine, alkyl, cycloalkyl or a radical of the formulae II or III or
- $R^1$ and $R^2$ together form a five- to eight-membered ring,
- $R^3$ is hydrogen or an alkyl radical,
- $R^4$ is hydrogen, halogen, nitro, acylamino, cyano, thiocyanato or an alkyl, aryl, alkylthio, arylthio or cycloalkylthio radical,
- $R^5$ is hydrogen or an alkyl or aryl radical or
- $R^4$ and $R^5$ together form a five- to eight-membered ring,
- $R^6$ is hydrogen, halogen, nitro, acylamino, cyano, thiocyanato or an alkyl, aryl, alkylthio, arylthio or cycloalkylthio radical,
- $R^7$ is an alkyl or cycloalkyl radical, a perfluorinated or highly fluorinated alkyl radical or an aryl, arylalkyl, aryl or heteroaryl radical or an alkylene or arylene radical and
- m is 1 or 2 and
- n is 0, 1, 2 or 3.

Those compounds of the formula I are particularly preferred in which $R^7$ is an alkyl radical having 1 to 4 carbon atoms, a highly fluorinated or perfluorinated alkyl radical having 1 to 4 carbon atoms or an aryl radical of the formula IV

in which $R^{15}$ to $R^{19}$ are identical or different and hydrogen atoms or halogen atoms, preferably fluorine, chlorine or bromine, alkyl radicals which have up to 6 carbon atoms and are unsubstituted or substituted by halogen atoms, preferably chlorine or bromine, aryl or aryloxy radicals and in which individual methylene groups can be replaced by oxygen or sulfur. atoms and in which in each case two of these radicals can be linked to form a 5- or 6-membered ring, cycloalkyl radicals having up to 8 carbon atoms, alkenyl radicals having up to 6 carbon atoms or aryl or aryloxy radicals having up to 10 carbon atoms, the total number of the carbon atoms in the radicals $R^{15}$ to $R^{19}$ being not more than 12.

Those compounds of the formula I are also preferred in which $R^7$ is a naphthyl or heteroaryl radical having up to 10 carbon atoms, an alkylene radical having up to 6 carbon atoms or an arylene or heteroarylene radical having up to 14 carbon atoms.

Those compounds of the formula I are very particularly preferred in which
$R^2$, $R^3$, $R^4$ and $R^6$ are a hydrogen atom, $R^5$ is a methyl group, $R^7$ is a methyl, ethyl, trifluoromethyl, 1,1,2,3,3,3-hexafluoropropyl, phenyl, tolyl, 4-fluorophenyl, 4-chlorophenyl, 4-bromophenyl or 4-nitrophenyl radical, m is 1 and n is 0 or 1.

In the compounds of Formula I according to the invention, the radical $R^7$ can, for example, be selected from the following: methyl, ethyl, propyl, isopropyl, butyl, hexyl, octyl, decyl, dodecyl, hexadecyl, octadecyl, 10-camphyl, chloromethyl, 2-chloroethyl, 3-chloropropyl, dichloromethyl, trichloromethyl, difluoromethyl, trifluoromethyl, 2,2,2-trifluoroethyl, 3,3,3,2,1,1-hexafluoropropyl, perfluorohexyl. trimethylsilylmethyl, methanesulfonylmethyl, phenyl, benzyl, 4-acetylphenyl, 4-acetylaminophenyl, 2-, 3- or 4-bromophenyl, 2-, 3- or 4-chlorophenyl, 2-, 3- or 4-fluorophenyl, 4-iodophenyl, 2-cyanophenyl, 4-cyanophenyl, 2-, 3- or 4-methylphenyl, 4-ethylphenyl, 4-propylphenyl, 4-isopropylphenyl, 4isobutylphenyl, 4-tert.-butylphenyl, 4-tert.-amylphenyl, 4-hexylphenyl, 4-methoxyphenyl, 4-butoxyphenyl, 4-hexadecyloxyphenyl. 2-, 3- or 4-trifluoromethylphenyl, 2- or 4-trifluoromethoxyphenyl, 2-, 3- or 4-nitrophenyl, 3- or 4-carboxyphenyl, 2-methoxycarbonylphenyl, 4-tetrafluoroethoxyphenyl. β-styryl, 4-acetylamino-3-chlorophenyl, 4-acetylamino-3-fluorophenyl, 3,5-bistrifluoromethylphenyl, 2,5-bis(2,2,2-trifluoroethoxy)-phenyl, 2,5-dimethylphenyl, 2,4-, 2,5- or 3,4-dimethoxyphenyl, 2,4-diisopropylphenyl, 5-bromo-2-methoxyphenyl, 2- or 3-chloro-4-fluorophenyl, 3-chloro-2-methylphenyl, 3-chloro-4-methoxyphenyl, 2-chloro-6-methylphenyl,2-chloro-4-trifluoromethylphenyl, 5-chloro-2-methoxyphenyl, 5-fluoro-2-methylphenyl, 2,5- or 3,4-dibromophenyl, 2,3-, 2,4- or 2,5-, 2,6-, 3,4- or 3,5-dichlorophenyl, 2-(2,4-dichlorophenoxy)-phenyl, 4-(2-chloro-6-nitrophenoxy)-phenyl, 4-(3-chloro-2cyanophenoxy)phenyl, 2,4- or 2,5-difluorophenyl, 3-carboxy-4-chlorophenyl, 4-chloro-3-nitrophenyl, 2-methyl-5-nitrophenyl, 4-chloro-3- or 2-chloro-5trifluoromethylphenyl, 4-(2,2-dichlorocyclopropyl)-phenyl, 2,4-dinitrophenyl, 4-dimethylamino-3-nitrophenyl, 2-nitro-4-trifluoromethylphenyl, 2,4,6-trimethylphenyl, 2,4,6-triisopropylphenyl, 2,3,4-, 2,4,5- or 2,4,6-trichlorophenyl, 4-chloro-2,5-dimethylphenyl, 2,4-dichloro-5-methylphenyl, 3,5-dichloro-2-hydroxyphenyl, 3,5-dichloro-4-(4-nitrophenoxy)-phenyl, 4-(2-chloro-4-nitrophenoxy)-3,5-dichlorophenyl, 4-bromo- 2,5difluorophenyl, 2,4-dimethyl-3-nitrophehenyl, 3,5-dinitro-4-methylphenyl, 2,3,5,6-tetramethylphenyl, 4-methoxy-2,3,6-trimethylphenyl, 2,5-dibromo-3,6-difluorophenyl, 2,3,4,5,6-pentafluorophenyl, 1- or 2naphthyl, 5-diazo-6-oxo-5,6-dihydro-1-naphthyl, 6-diazo-5-oxo-5,6-dihydro-1-naphthyl,5-diazo-6-oxo-5,6-dihydro-8-naphthyl, 5-diazo-3-methoxy-6-oxo-5,6-dihydro-8naphthyl, 5-dimethylamino-1-naphthyl, 1-anthracenyl, 2anthraquinonyl, 8-quinolinyl, 2-thienyl, 5-chloro-2thienyl, 4-bromo-2,5-dichloro-3-thienyl, 4,5-dibromo-2thienyl, 2,3-dichloro-5-thienyl, 2-bromo-3-chloro-5thienyl, 3-bromo-2-chloro-5-thienyl, 3-bromo-5-chloro-2thienyl, 2,5-dichloro-3-thienyl, 2-(2-pyridyl)-5-thienyl, 5-chloro-1,3-dimethyl-4-pyrazolyl, 3,5-dimethyl-4-isoxazolyl, 2,4-dimethyl-5-thiazolyl, 2-acetylamino-4-methyl-5-thiazolyl or 1,4-butylene, 2-oxo-1,3-propylene, 1,2- or 1,3-phenylene, 3-methyl-1,2-phenylene, 2,4,6-trimethyl-1,3-phenylene, 4,4'-biphenylene, 4,4'-methylenediphenylene, 4,4'-oxybiphenylene, 1,5-naphthylene, 2-chloro-3,5-thienylene, 2-(1-methyl-5-trifluoromethylpyrazol-3-yl)-3,5-thienylene.

The radical $R^1$, for example, can be selected from the following: methyl, chloromethyl, bromomethyl, ethyl, propyl, isopropyl, butyl, isobutyl, hexyl, cyclohexyl, octyl, phenyl, 4-acetylaminophenyl, 4-acetoxyphenyl, 3- or4-benzyloxypheny1,3-benzyloxy-4-methoxyphenyl,4-benzyloxy-3-methoxyphenyl, 4-biphenyl, 3,5-bis(trifluoromethyl)-phenyl, 2-, 3- or 4-fluorophenyl, 2-, 3- or 4-chlorophenyl, 2-, 3- or 4-bromophenyl, 4-iodophenyl, 2-, 3- or 4-cyanophenyl, 2-, 3- or 4-methylphenyl, 2-, 3- or 4-ethylphenyl, 2-, 3- or 4-propylphenyl, 2-, 3- or 4isopropylphenyl, isobutylphenyl, 2-, 3- or 4-sec.-butylphenyl, 2-, 3- or 4-tert.-butylphenyl, 2-, 3- or 4-pentylphenyl, 2-, 3- or 4-hexylphenyl, 2-, 3- or 4-cyclohexylphenyl, 2-, 3- or 4-nonylphenyl or 2-, 3- or 4-dodecylphenyl, 2-, 3- or 4-methoxyphenyl, 2-, 3- or 4-ethoxyphenyl, 2-, 3- or 4-isopropoxyphenyl, 2-, 3- or 4-butoxyphenyl, 2-, 3- or 4-pentoxyphenyl, 2-, 3- or 4-octyloxyphenyl, or 2-, 3- or 4-decyloxyphenyl, 2,3-, 2,4-, 2,6-, 3,4- or 3,5-difluorophenyl, 2,3-, 2,4-, 2,6-, 3,4- or 3,5-dichlorophenyl, 2,3-, 2,4-, 2,6-, 3,4- or 3,5-dibromophenyl, 3-(3,4-dichlorophenoxy)-phenyl, 3-(3,5-dichlorophenoxy)-phenyl, 3-bromo-4-fluorophenyl, 5-bromo-2,4-dimethoxyphenyl, 2-chloro-6-fluorophenyl, 2-chloro-5-, 2-chloro-6-, 4-chloro-3-or5-chloro-2-nitropheny1,3-(4-chlorophenoxy)phenyl, 3,4-bisbenzyloxy-phenyl, 2,3-, 2,4-, 2,5-, 3,4- or 3,5-dimethoxy-phenyl, 2,3-, 2,4-, 2,5-, 3,4- or 3,5-diethoxy-phenyl, 2,3-, 2,4-, 2,5-, 3,4- or 3,5-dibutoxyphenyl or 2,3-, 2,4-, 2,5-, 3,4- or 3,5-dihexyloxypheny-1,2,4-dimethoxy-3-methyl-phenyl, 2-ethoxy-5-methoxyphenyl, 3-chloro-4-methyl-phenyl, 2,4- or 2,5-dimethylphenyl, 2-, 3- or 4-methoxyethyl-phenyl, 2-, 3- or 4-ethoxyethyl-phenyl, 2-, 3- or 4-butoxyethylphenyl, 2,6-dinitro-phenyl, 2,4,6-trimethylphenyl, 3,4,5-trimethoxyphenyl, 3,4,5-triethoxy-phenyl, 2,3- or 3,4methylenedioxyphenyl, 2- or 3-thienyl, 2-fluorenyl, 9-anthryl, 1-pyrenyl, 9-phenanthryl, 5-bromo-2-thienyl, 3-methyl-2-thienyl, 5-methyl-2-thienyl, 5-nitrofuryl, 10-chloro-9-anthryl or ferrocenyl.

These $R^1$ and $R^7$ radicals are preferred particularly for the reason that the starting compounds on which they are based are commercially available. However, further compounds can be prepared in a simple manner by methods familiar to those skilled in the art, and hence any radicals can be used which fall within the scope of Formula I.

The compounds listed above have absorption maxima in the range between 200 and 550 nm and are therefore very well suitable for irradiation with high-energy UV radiation in the range of UV2 radiation (220 to 280 nm), UV3 radiation (300 to 350 nm) or UV4 radiation (350 to 450 nm) and also with high-energy visible light (450 to 550 nm). They show high activities even on irradiation with radiation of a wavelength of <220 nm; however, because of their high absorption in this region, they are preferentially applicable to so-called "toplayer imaging" processes.

The compounds of Formula I can be prepared in any known manner. For example, 1-Benzenesulfonyloxy- and 1-(toluene-4-sulfonyloxy)2-pyridone and processes for the preparation thereof are known from E. C. Taylor et al., J. Org. Chem., 35, 1672, 1970. The radiation sensitivity of these compounds was, however, not recognized. Novel 1-sulfonyloxy-2-pyridones and the preparation thereof are described in Attorney Docket No. 16878/448, corresponding to German Patent Application P 41 12 967.9, filed concomitantly, and hereby incorporated by reference in its entirety.

The use of 1-sulfonyloxy-2-pyridones as photooxidants in radiation-sensitive mixtures which contain a leuco dye has been disclosed by U.S. Pat. No. 4,425,424. In such mixtures, the photooxidant effects during irradiation, for example, an oxidation, of the leuco dye results in an intensive color change and causes a visual contrast between exposed and unexposed areas. Such color changes are desired in industry, for example in the production of printing forms, in order to enable the copying result to be assessed after exposure already before development.

The radiation-sensitive mixture according to the invention is distinguished by a high sensitivity over a wide spectral range. It shows high thermal stability and makes it possible to reproduce precise details of even very fine structures in an original. The acid generated during irradiation does not have a corrosive action, so that the mixture can also be used on sensitive substrate materials.

Surprisingly, when the mixtures according to the invention are irradiated, sulfonic acids are generated in a high quantum yield. Due to their high molecular weight, the sulfonic acids show a much reduced tendency to diffusion or mobility in the radiation-sensitive layer. The high efficiency of the acid generation means that the mixtures according to the invention show a substantially increased sensitivity.

The negative-working, radiation-sensitive mixtures according to the invention additionally show not only a high thermal and plasma-etching resistance but also outstanding lithographic properties which allow resolution even in the half-micrometer and sometimes also in the sub-half-micrometer range. After imagewise irradiation and subsequent development, a negative image of the mask true to the details is obtained. The resist areas show steep flanks. In the areas not irradiated, the resist layer is completely detached, i.e., no remnants or residues of the layer remain on the substrate. The sulfonic acids generated in the photolysis lead to efficient crosslinking of the resist component b), which permits the production of high-sensitivity negative-working mixtures.

It was furthermore surprising that the 1-sulfonyloxy-2-pyridones of the formula I can be activated also by high-energy short-wave radiation and that, for example, the photoresist for high-production of a high-sensitivity energy UV2 radiation (248 nm) is thus possible. In particular, however, it was unexpected that there is still a sufficient spectral sensitivity, which leads to a cleavage of the molecule to give a sulfonic acid, even lithography in the range of conventional optical lithography (436 nm).

In th.: mixture according to the invention, the 1-sulfonyloxy-2-pyridones should show a higher molar absorption for radiation of the wavelength from about 220 to 500 nm than the remaining constituents of the mixture.

Recording materials produced with the mixtures according to the invention show an image differentiation which meets the most stringent demands, and an improvement in the contrast and resolving power. For example, the mixtures according to the invention allow a high-sensitivity, negative-working photoresist for high-energy UV2 radiation (for example 248 nm) to be produced.

Since the mixture according to the invention is sensitive over a wide spectral range, any actinic radiation is generally suitable for imagewise irradiation. Actinic radiation is to be understood in this context as meaning any radiation whose energy corresponds at least to that of shortwave visible light (<550 nm). Especially UV radiation in the range from 150 to 550 nm, preferably from 200 to 450 nm and particularly preferably from 240 to 440 nm. Electron beams or x-ray radiation are suitable for irradiation.

Furthermore, the 1-sulfonyloxy-2-pyridones of Formula I can be combined with any known additional acid generators such as onium salts, halogen compounds, especially trichloromethyltriazine derivatives or trichloromethyloxadiazole derivatives, 1,2-disulfones, o-quinonediazidesulfonyl chlorides or organometal/organohalogen combinations. Mixtures with bis(sulfonyl)-diazomethanes and sulfonyl-carbonyldiazomethanes are also possible. In such mixtures, however, the above-mentioned disadvantages associated with the additional acid-generator may reappear.

The content of acid-generating compounds a) in the mixture according to the invention may be varied depending on the intended use of the mixture and is in general 0.5 to 25% by weight, preferably 1 to 15% by weight, relative to the total weight of the solids in the mixture.

The acid-crosslinkable compounds b) used can be any known in the art and can be chosen from the resols disclosed in GB 2,082,339, and also aromatics substituted by alkoxymethyl or oxiranylmethyl groups (see EP-A 0,212,482) and monomeric and oligomeric melamine/formaldehyde condensates and urea/formaldehyde condensates (see EP-A 0,133,216, DE-A 3,634,671, DE 3,711,264). Examples of the first type are especially the commercially available resol products Bakelite R 5363, Bakelite R 17620, Bakelite R 10282 and Kelrez 40-152 (Bakelite and Kelrez are registered trademarks). However, resol derivatives are not altogether preferred, since they show relatively high absorptions in the deep UV region and thus cause an impairment of the image reproduction.

More suitable crosslinking agents are those known from EP-A 0,212,482 which is hereby incorporated by reference, of the formula V $$(R^4O-CHR^6)_n\text{-}A\text{-}(CHR^6-OR^5)_m \quad\quad (V)$$

in which

A is -B- or -B-Y-B- and

B is a substituted or unsubstituted mononuclear aromatic hydrocarbon or an oxygen- or sulfur-containing heterocyclic aromatic compound, Y is a single bond, $(C_1-C_4)$alkylene or $(C_1-C_4)$alkylenedioxy, whose chains can be interrupted by oxygen atoms, —O—, —S—, —$SO_2$—, —CO—, —$CO_2$—, —O—$CO_2$—, —CONH— or —O—$C_6H_4$—O—, $R^4$ and $R^5$ are hydrogen, $(C_1-C_6)$alkyl, $C_5$- or $C_6$-cycloalkyl, substituted or unsubstituted $(C_6-C_{12})$aryl, $(C_6-C_{12})$aralkyl or acyl, $R^6$ is hydrogen, $(C_1-C_4)$alkyl or substituted or unsubstituted phenyl, m is 0, 1, 2 or 3 and n is 1, 2, or 3, n+m being at least 2.

Typical crosslinking agents are accordingly aromatics and heterocyclic compounds which are polysubstituted by hydroxymethyl, acetoxymethyl and methoxymethyl groups. Polymeric or oligomeric compounds which have substitution patterns of this type and are disclosed, for example, in EP-A 0,282,724 can likewise advantageously be used.

Further preferred crosslinking agents are melamine-/formaldehyde derivatives which have, for example, at least two free N-hydroxymethyl, N-alkoxymethyl or N-acyloxymethyl groups. In particular the N-alkoxymethyl derivatives are suitable for use in the radiation-sensitive mixture according to the invention.

Finally, low molecular weight or oligomeric silanols can be used as silicon-containing crosslinking agents. Examples of these are dimethyl- and diphenyl-silanediols, and oligomers which have already been precondensed and contain these units. EP-A 0,377,155, for example, discloses compounds which can be used for the purpose according to the invention.

The crosslinking agents are capable of crosslinking with the polymeric binders at elevated temperatures under the action of the photolytically generated acid of the compound of Formula I. The general feature is that they can form a carbonium ion under the said conditions of temperature and acid.

The content of the acid-crosslinkable compound b) in the radiation-sensitive mixture can vary depending on the intended use of the mixture and is generally 1 to 50% by weight, preferably 5 to 25% by weight, each relative to the total weight of the solid constituents of the mixture.

The radiation-sensitive mixture according to the invention also contains at least one polymeric binder c) which is insoluble in water, but soluble or at least swellable in aqueous alkaline solutions. Any known binder or mixture of binders having this characteristic can be used. The binder is distinguished in particular by being well compatible with the other constituents of the radiation-sensitive mixture according to the invention and having the lowest possible characteristic absorption, i.e., a high transparency, especially in the wavelength range from 190 to 550 nm.

For the conventional applications, i.e., with light sources in the near UV range, binders based on novolak condensation resins, which generally have been used in combination with naphthoquinonediazides as the photoactive components, are particularly suitable for this purpose. Such phenol-formaldehyde condensates have been described many times and can, as the phenolic component, contain phenol, the three position-isomeric cresols or other alkylphenols, for example xylenols. Apart from formaldehyde, other aldehydes can also be utilized for preparing the polymer. However, the polymers containing hydroxyl groups, described below, can also be used for irradiations with near UV light, and these can be admixed with the novolak polymers described above in a proportion of up to 50%, preferably up to 20%.

For applications in the UV2 range, however, different polymeric materials are required. In particular, these do not include binders containing solely novolaks which are generally used as photoactive components in combination with naphthoquinonediazides. Although novolaks show in the exposed areas an increase in the solubility in aqueous alkaline developers after imagewise exposure to short wave radiation, their characteristic absorption in the wavelength range desired for the exposure is undesirably high.

However, a binder based on a mixture novolak condensation resins with other resins of higher transparency is suitable. The mixing ratios here depend predominantly on the nature of the binder to be mixed with the novolak resin. Especially important factors are the degree of characteristic absorption of the binder in the said wavelength range, and also the miscibility with the other constituents of the radiation-sensitive mixture. In general, however, the binder of the radiation-sensitive mixture according to the invention can preferably contain at most 50% by weight, especially at most 20% by weight, of a novolak condensation resin.

Suitable binders include homopolymers or copolymers of 4-hydroxystyrene and homopolymers and copolymers of alkyl derivatives thereof, for example of 3-methyl-4-hydroxystyrene, 2,3- or 3,5-dimethyl-4-hydroxystyrene, and homopolymers or copolymers of other vinylphenols, for example of 2- or 3-hydroxystyrene or esters or amides of acrylic acid with aromatics containing phenolic groups. Polymerizable compounds such as styrene, methyl (meth)acrylate or the like can be used as comonomers.

Mixtures having an increased plasma resistance are obtained when silicon-containing vinyl monomers, for example vinyltrimethylsilane, are also used for the preparation of the binders. The transparency of these binders is in general higher in the deep UV range, so that improved structuring is possible.

Equally well, homopolymers or copolymers of maleimide can also be used. These binders too show a high transparency in the deep UV range. Here again, the comonomers preferably used are styrene, substituted styrenes, vinyl ethers, vinyl esters, vinylsilyl compounds or (meth)acrylates.

Finally, copolymers of styrene can be used with comonomers which effect an increase in solubility in aqueous alkaline solutions. These include, for example, maleic anhydride and maleic acid half-esters.

The said binders can also be mixed with one another if this does not impair the optical quality of the radiation-sensitive mixture. However, binder mixtures are generally not preferred.

The binder content can vary depending on the intended use of the mixture and is in general 30 to 95% by weight, preferably 40 to 90% by weight, particularly preferably 50 to 85% by weight, relative to the total weight of the solid constituents of the radiation-sensitive mixture.

The extinction of the binder or of the combination of binders for radiation of the wavelength from about 220 to 500 nm is preferably less than 0.5, more preferably less than 0.3 $\mu m^{-1}$.

If appropriate, one or more of dyes, pigments, plasticizers, wetting agents, flow agents polyglycols and cellulose ethers, for example ethylcellulose, can also be added to the radiation-sensitive mixtures according to the invention in order to meet special requirements, such as flexibility, adhesion and gloss. Additional additives known in the art can also be used for their known purpose.

When a substrate is to be coated with the radiation sensitive mixture according to the invention it is possible to use any known substrate and to use any known coating method. The radiation-sensitive mixture according to the invention is expediently dissolved in a solvent or in a combination of solvents. Ethylene glycol and propylene glycol and the monoalkyl and dialkyl ethers derived from them, especially the monomethyl and dimethyl ethers and the monoethyl and diethyl ethers, esters derived from aliphatic ($C_1$–$C_6$)-carboxylic acids and either ($C_1$–$C_8$)-alkanols or ($C_1$–$C_8$)alkanediols or ($C_1$–$C_6$)-alkoxy($C_1$–$C_8$)-alkanols, for example ethyl acetate, hydroxyethyl acetate, alkoxyethyl acetate, n-butyl acetate, propylene glycol monoalkyl etheracetate, especially propylene glycol methyl ether-acetate and amyl acetate, ethers such as tetrahydrofuran and dioxane, ketones such as methyl ethyl ketone, methyl isobutyl ketone, cyclopentanone and cyclohexanone, N,N-dialkyl-carboxylic acid amides such as N,N-dimethylformamide and N,N-dimethylacetamide, and also hexamethylphosphotriamide, 1-methyl-pyrrolidin-2-one and butyrolactone, and also any desired mixtures of these, are particularly suitable for this purpose. Amongst these, the glycol ethers, aliphatic esters and ketones are particularly preferred.

Ultimately, the choice of the solvent or solvent mixture depends on the coating process used, on the desired layer thickness and on the drying conditions. The solvents must also be chemically inert to the other layer constituents under the conditions used.

The solution prepared with the said solvents generally has a solids content from 5 to 60% by weight, preferably up to 50% by weight.

Finally, the invention also relates to a radiation-sensitive recording material which comprises a substrate and, preferably located thereon, a radiation-sensitive layer of the radiation-sensitive mixture according to the invention.

Possible substrates are all those materials of which capacitors, semiconductors, multi-layer printed circuits or integrated circuits are composed or from which these can be produced. Silicon substrates which can also be thermally oxidized and/or coated with aluminum, and also doped, merit special mention. In addition, all other substrates usual in semiconductor technology are possible, such as silicon nitride, gallium arsenide and indium phosphide. Moreover, the substrates known from liquid crystal display manufacture are possible, such as glass or indium-tin oxide, and also metal plates and foils—for example of aluminum, copper, zinc foils, bimetal and trimetal foils, and also electrically non-conductive foils on which metals have been vapor-deposited, and paper. These substrates can be thermally pretreated, superficially roughened, incipiently etched or, to improve desired properties, for example to enhance the hydrophilic character, pretreated with chemicals.

To impart better cohesion and/or better adhesion of the radiation-sensitive layer to the substrate surface, the layer can contain an adhesion promoter. The same effect can be achieved by an adhesion-promoting interlayer. In the case of silicon or silica substrates, adhesion promoters of the aminosilane type such as, for example, 3-aminopropyltriethoxysilane or hexamethyldisilazane, can be used for this purpose.

Suitable supports for the production of photomechanical recording layers, such as printing forms for letterpress printing, planographic printing, screen printing and flexographic printing, are in particular aluminum plates, which may have been anodically oxidized, grained and/or silicated beforehand, and also zinc and steel plates which may be chromium-plated, and also plastic films and paper.

The recording material according to the invention is exposed imagewise with actinic radiation. Suitable radiation sources are especially metal halide lamps, carbon arc lamps, xenon lamps and mercury vapor lamps. Likewise, exposure can be carried out with high-energy radiation such as laser radiation, electron beams or x-rays. However, lamps which can emit: light of a wavelength from 190 to 260 nm, i.e., especially xenon lamps and mercury vapor lamps, are particularly preferred. Furthermore, laser light sources can also be used, for example excimer lasers, especially KrF or ArF lasers, which emit at 248 and 193 nm respectively. The radiation sources must show adequate emission in the said wavelength ranges.

The thickness of the light-sensitive layer depends on the intended use. In general, it is between 0.1 and 100 $\mu$m, preferably between 1 and 10 $\mu$m.

The recording material is generally used with radiation of wavelength of 150 to 550 nm preferably 200 to 450 nm, more preferably 240 to 440 nm.

The invention also relates to a process for preparing a radiation-sensitive recording material. The radiation-sensitive mixture can be applied to the substrate by any known method including spraying, flow-coating, rolling, whirler-coating and dipcoating. The solvent is then removed by evaporation, so that the radiation-sensitive layer remains on the surface of the substrate. The removal of the solvent can be promoted by heating the layer to temperatures of up to 150° C. The mixture can, however, also be first applied in the above-mentioned way to a temporary support, from which it is transferred under pressure and at an elevated temperature to the final support material. The materials used as temporary support can in principle be all those which are also suitable as support materials. Subsequently, the layer is irradiated imagewise and heated briefly to accelerate the crosslinking reaction. The layer is then treated with a developer solution which dissolves and removes the unexposed areas of the layer, so that a negative image of the original used in the imagewise irradiation remains on the substrate surface.

Suitable developers include all those known in the art and are especially aqueous solutions which contain silicates, metasilicates, hydroxides, hydrogen phosphates and dihydrogen phosphates, carbonates or hydrogen carbonates of alkali metal ions, alkaline earth metal ions and/or ammonium ions, and also ammonia and the like. Metal ion-free developers are described in U.S. Pat. No. 4,729,941, EP-A 0,062,733, U.S. Pat. No. 4,628,023, U.S. Pat. No. 4,141,733, EP-A 0,097,282 and EP-A 0,023,758. The content of these substances in the developer solution is in general 0.1 to 15% by weight, preferably 0.5 to 5% by weight, relative to the weight of the developer solution. Preferably, metal ion-free developers are used. Small quantities of a wetting agent may be added to the developers, in order to facilitate the detachment of the soluble areas of the layer.

The developed layer structures can be post-hardened. This is effected in any known manner and in general by heating on a hotplate up to a temperature below the flow temperature and subsequent exposure of the whole area with the UV light from a xenon-mercury vapor lamp (range from 200 to 250 nm). As a result of the post-hardening, the image structures are additionally crosslinked, so that in general they have a flow resistance up to temperatures of more than 200.C. The post-hardening can also be effected without a temperature increase solely by irradiation with a high dosage of high-energy UV light.

The radiation-sensitive mixture according to the invention may be used in the production of integrated circuits or of individual electrical components by lithographic processes, since they show a high light sensitivity, especially in the case of irradiation with light of a wavelength between 190 and 300 nm. Since the mixtures bleach very well on exposure, finer structures can be obtained than is possible with the known mixtures. The developed resist layer here serves as a mask for the subsequent process steps. Examples of such steps are etching of the layer support, the implantation of ions in the layer support or the precipitation of metals or other materials on the layer support.

The examples described below illustrate the invention, but, do not in any way limit the invention. In the following text, p.b.w. means parts by weight and p.b.v. means parts by volume, which have the same relationship to parts by weight as the g to the cm$^3$.

Preparation Examples 1-10 illustrate the preparation of 1-sulfonyloxy-2-pyridone useful as a compound a) of the present invention.

PREPARATION EXAMPLE 1

Stage 1: 88 p.b.w. of acetyl chloride and 128 p.b.w. of methyl 2,3-dimethylcrotonate were added dropwise at 15° C. to 280 p.b.w. of aluminum trichloride in 250 p.b.v. of methylene chloride. The solution was heated under reflux for 3 hours and, after cooling, poured onto ice. After the organic phase had been separated off, the remaining mixture was thoroughly stirred with 500 p.b.v. of methylene chloride. The combined organic phases were washed with water, and a solution of 76 p.b.w. of hydroxylamine hydrochloride in 200 p.b.v. of water was then slowly added. With the onset of heating, the methylene chloride distilled off. The solution was heated for 3 hours to a bath temperature of 120° C. After cooling, it was then extracted with n-hexane. The pH of the remaining aqueous solution was adjusted to 5 with 5% sodium hydroxide solution, the depositing precipitate was filtered off with suction, triturated with water, again filtered off with suction and dried. This gave 82 p.b.w. of 1-hydroxy-3,4,6-trimethyl-2-pyridone having a melting point of 130° C.

Stage 2: A solution of 3.4 p.b.w. of triethylamine in 20 p.b.v. of methylene chloride was slowly added dropwise with stirring to a solution, cooled to 5° C., of 5.0 p.b.w. of the compound described above and 6.8 p.b.w. of 4-fluorobenzenesulfonyl chloride in 60 p.b.v. of methylene chloride, in such a way that the preset temperature remained constant. The solution was then heated to room temperature and stirred for 72 hours. The organic phase was then washed with water, dried and concentrated. This gave 10.8 p.b.w. of a crude product having a melting point of 120° C. This was again dissolved in methylene chloride and passed over a silica gel column; the solvent used was methylene chloride. The combined product fractions were concentrated. This gave 8.6 p.b.w. of 1-(4-fluorobenzenesulfonyloxy)-3,4,6-trimethyl-2-pyridone having a melting point of 123° C.

Analysis: calculated C 54.01%, H 4.53%, N 4.50%. (311.34) found C 53.9%, H 4.7%, N 4.6%.

PREPARATION EXAMPLE 2

1st Stage: 230 p.b.w. of methyl 3-methylcrotonate were added at 50° to 60° C. to a suspension of 532 p.b.w. of aluminum trichloride in 250 p.b.v. of ethylene chloride and 282 p.b.w. of chloroacetyl chloride in such a way that the temperature was just held. The mixture was then heated for one hour to 65° to 70° C. and poured onto ice. The aqueous phase was extracted with methylene chloride and the organic phase was washed with water and saturated sodium hydrogen carbonate solution. After drying over sodium sulfate, the product was fractionally distilled. Yield: 280 p.b.w. (74%), boiling point 120° to 122° C./5 mm Hg.

2nd Stage: 382 p.b.w. of the product described above were dissolved in a mixture of 1000 p.b.v. of glacial acetic acid and 10 p.b.v. of concentrated sulfuric acid, and the solution was heated to the boil. The calculated quantity of methyl acetate was distilled off through a short column. The glacial acetic acid was then removed in vacuo and the residue was poured into ice water, the pyrone crystallizing. For further purification, the product separated off can be distilled at 116° to 117° C./2 mm Hg. After recrystallization from carbon tetrachloride, this gave 296 p.b.w. of 6-chloromethyl-4-methyl-2-pyrone. Yield: 93%, melting point 78° C.

3rd Stage: 320 p.b.w. of the product described above were heated under reflux for 8 hours together with 540 p.b.w. of triphenylphosphine and 1500 p.b.v. of acetonitrile. The mixture was cooled in ice and the precipitated product was filtered off with suction. The mother liquor was concentrated, further product precipitating, which was filtered off with suction. This gave 799 p.b.w. of (4-methyl-6-oxo-6H-pyron-2-yl-methyl)-triphenyl-phosphonium chloride.

4th Stage: 106 p.b.w. of the product described above were dissolved in 200 p.b.v. of methanol together with 35.5 p.b.w. of 4-chlorobenzaldehyde. A solution of 6 p.b.w. of sodium in 150 p.b.v. of methanol was poured into the solution, the mixture assuming a transient red color and reacting highly exothermically. The mixture was stirred for 6 hours at room temperature and cooled to −25.C., and the precipitated product was filtered off with suction. The latter was washed with cooled methanol, stirred with water and again filtered with suction. This gave 26 p.b.w. of 6-(4-chlorostyryl)-4-methyl-2-pyrone, which can be recrystallized from acetonitrile. Melting point 144° C.

5th Stage: 22.5 p.b.w. of the product described above were heated to about 70° C. with 9 p.b.w. of hydroxylamine hydrochloride and 110 p.b.w. of 2-aminopyridine. The mixture was left for 72 hours at this temperature, a further 3.3 p.b.w. of hydroxylamine hydrochloride being added each time after 3, 18, 30 and 42 hours. After the mixture had cooled down, it was taken up in methylene chloride and washed with dilute hydrochloric acid and water. The organic phase was stirred up in a solution of 10 p.b.w. of sodium hydroxide in 700 p.b.v. of deionized water, and the resulting sodium salt was filtered off and dissolved in 600 p.b.v. of hot water. The aqueous solution was adjusted to pH 5 by addition of glacial acetic acid and cooled down. The crude product thus crystallizing was filtered off with suction and dried. This gave 15 p.b.w. of a crude product having a melting point of 195° C., and this was recrystallized from methylene chloride. This gave yellowish crystals of [6-(4-chlorostyryl)-1-hydroxy-4-methyl-2-pyridone] having a melting point of 205° C.

Analysis: calculated C 64.25%, H 4.62%, N 5.35%. (261.70) found C 64.2%, H 4.6%, N 5.4%.

6th Stage: 1.85 p.b.w. of triethylamine in 20 p.b.v. of methylene chloride were added dropwise at 10° C. to a solution of 4 p.b.w. of the product described above and 20 p.b.w. of methanesulfonyl chloride in 50 p.b.v. of methylene chloride. The solution was stirred at room temperature for a further 24 hours, extracted by shaking with water, and the solvent was removed in a rotary evaporator. The crystalline product was dried, passed on a silica gel column and eluted with methylene chloride. The combined product fractions gave, after concentrating, 4.2 p.b.w. of 6-(4-chlorostyryl)-1-methanesulfonyloxy-4-methyl-2-pyridone having a decomposition point of 190° C. A sample was recrystallized from acetonitrile and gave a product having a melting point of 193° C.

Analysis: calculated C 53.02%, H 4.15%, N 4.12%. (339.77) found C 52.7%, H 4.4%, N 4.2%.

PREPARATION EXAMPLE 3

Stage 1: 11.2 p.b.w. of 4,6-diphenyl-2-pyrone were stirred for 22 hours at 80.C together with 30 p.b.w. of 2-aminopyridine and 10.4 p.b.w. of hydroxylamine hydrochloride. After the mixture had cooled down, 200 p.b.v. of methylene chloride were added. The organic phase was then washed with a solution of 30 p.b.v. of concentrated hydrochloric acid and 200 p.b.v. of water and then with water alone, extracted twice by shaking with a solution of 10 p.b.w. of sodium hydroxide and 300 p.b.w. of water, and the aqueous extracts were adjusted to pH 4 by addition of glacial acetic acid. The precipitate was filtered off with suction, washed with water and dried. The yield was 10.6 p.b.w. of 1-hydroxy-4,6-diphenyl-2-pyridone having a melting point of 159° C.

Stage 2: A solution of 2.1 p.b.w. of triethylamine in 20 p.b.v. of methylene chloride was slowly added with stirring to a solution, cooled to 5° C., of 5.0 p.b.w. of the compound described above and 4.64 p.b.w. of 4-chlorobenzenesulfonyl chloride in 50 p.b.v. of methylene chloride, in such a way that the temperature remained constant. The solution was heated to room temperature and stirred for 120 hours. The organic phase was then washed with water, dried and concentrated. This gave 8.6 p.b.w. of a crude product. This was twice digested in hot diisopropyl ether and filtered off with suction. Subsequently, it was recrystallized from acetonitrile. This gave 7.1 p.b.w. of 1-(4-chlorobenzenesulfonyloxy)-4,6-diphenyl-2-pyridone. The compound had a decomposition point of 165° C.

Analysis: calculated C 63.08%, H 3.68%, N 3.20%. (437.91) found C 63.3%, H 3.7%, N 3.3%.

PREPARATION EXAMPLE 4

Stage 1: 41.4 p.b.w. of 6-cyclohexyl-1-hydroxy-4-methyl-2-pyridone were dissolved in 220 p.b.w. of concentrated sulfuric acid, and 18 p.b.w. by weight of sodium nitrate were added in the course of 1 hour with ice cooling. The solution was stirred for a further 7 hours at 0° C., poured onto ice and extracted with methylene chloride. The organic phase was washed several times with water, dried, filtered and concentrated. The residue was dissolved in methanol, reprecipitated and then recrystallized from carbon tetrachloride. This gave 11.6 p.b.w. of the product nitrated in the 3-position and having a melting point of 160° C.

Stage 2: A solution of 2.6 p.b.w. of triethylamine in 20 p.b.v. of methylene chloride was slowly added with stirring to a solution, cooled to 5° C., of 6.0 p.b.w. of the compound described above and 3.0 p.b.w. of methanesulfonyl chloride in 50 p.b.v. of methylene chloride, in such a way that the temperature remained constant. The solution was heated to room temperature and stirred for 100 hours. The organic phase was then washed with water, dried and concentrated. This gave 8.3 p.b.w. of a crude product having a melting point of about 170° C. This was dissolved in methylene chloride and chromatographed over a silica gel column with methylene chloride as the solvent. The fractions obtained were concentrated, giving 7.2 p.b.w. of 6-cyclohexyl-1-methanesulfonyloxy-4-methyl-3-nitro-2-pyridone. The compound melted at 169° C.

Analysis: calculated C 47.26%, H 5.49%, N 8.48%. (330.37) found C 47.1%, H 5.5%, N 8.5%.

PREPARATION EXAMPLE 5

Stage 1: 50 p.b.w. of 1-hydroxy-4,6-dimethyl-2-pyridone were stirred for 8 hours at 130° C. together with 131 p.b.w. of sodium benzenesulfinate, 24 p.b.w. of paraformaldehyde and 250 p.b.w. of glacial acetic acid. After cooling, the precipitated product was filtered off with suction, washed with water and methanol and dried.

Stage 2: 6.0 p.b.w. of sodium were dissolved in 90 p.b.w. of methanol, and 27 p.b.w. of the compound described above were added. The solution was stirred at 80° C. for about 120 hours. After the mixture had cooled, it was freed of solvent, dissolved in water and adjusted with concentrated hydrochloric acid to pH 3. The precipitate was filtered off, and the remaining mother liquor was extracted with methylene chloride. The organic phase was washed, dried and concentrated. The residue was recrystallized from methanol and gave 10.2 p.b.w. of the desired product having a melting point of 120° C.

Stage 3: A mixture of 3.0 p.b.w. of triethylamine in 20 p.b.v. of methylene chloride was slowly added with stirring to a solution, cooled to 5° C., of 6.0 p.b.w. of the compound described above and 3.4 p.b.w. of methanesulfonyl chloride in 50 p.b.w. of methylene chloride, in such a way that the preset temperature remained constant. The mixture was heated to room temperature and stirred for 80 hours. The organic phase was then washed with water, dried and concentrated. This gave 10.2 p.b.w. of a viscous crude product. This was dissolved in methylene chloride and chromatographed over a silica gel column with methylene chloride as the solvent. The fractions obtained were concentrated, giving 5.9 p.b.w. of crude 1-methanesulfonyloxy-3,5-bis-methoxymethyl-4,6-dimethyl-2-pyridone. After recrystallization from diisopropyl ether, 4.8 p.b.w. of pure product melting at 73° C. remained.

Analysis calculated C 47.20%, H 6.27%, N 4.59%. (305.36) found C 46.9%, H 6.6%, N 4.6%.

PREPARATION EXAMPLE 6

Stage 1: A mixture of 23.6 p.b.w. of cyanoacetyl chloride in 25 p.b.w. of methylene chloride was added dropwise in the course of 20 minutes at a temperature of 20° C. to 28 p.b.w. of 0-benzylhydroxylamine and 23.7 p.b.w. of triethylamine in 200 p.b.v. of methylene chloride. After the solution had been stirred for one further hour, it was washed with water, dried and concentrated. This gave 45 p.b.w. of N-benzyloxy-2-cyanoacetamide.

Stage 2: 24 p.b.w. of the product described above, 12.7 p.b.w. of acetylacetone and 1 p.b.w. of diethylamine were dissolved in 50 p.b.v. of ethanol and heated under reflux for 1.5 hours. The solution was cooled to −20° C., and the precipitated crystals, which represent the desired 1-benzyloxy-3-cyano-4,6-dimethyl-2-pyridone, were filtered off with suction.

Stage 3: 28 p.b.w. of the product described above were dissolved in 400 p.b.v. of methanol in an autoclave, and 1 p.b.w. of a 10% palladium/barium sulfate catalyst was added. The mixture was hydrogenated at room temperature with hydrogen, 2.8 l of hydrogen being absorbed. Undissolved constituents of the mixture were filtered off, and the solution was concentrated. This gave 16.5 p.b.w. of 3-cyano-1-hydroxy-4,6-dimethyl-2-pyridone having a melting point of 240° C.

Stage 4: A solution of 2.0 p.b.w. of triethylamine in 20 p.b.v. of methylene chloride was slowly added with stirring to a solution, cooled to 5° C., of 2.9 p.b.w. of the compound described above and 2.3 p.b.w. of methanesulfonyl chloride in 50 p.b.v. of methylene chloride, in such a way that the preset temperature remained constant. After heating to room temperature, the solution was stirred for a further 100 hours, washed with water, dried and concentrated. This gave 4.0 p.b.w. of a crude product having a melting point of about 150° C. This was dissolved in methylene chloride and chromatographed over a silica gel column with methylene chloride as the solvent. The fractions obtained were concentrated, giving 3.2 p.b.w. of crude 3-cyano-1-methanesulfonyloxy-4,6-dimethyl-2-pyridone. Recrystallization from n-hexane and drying gave 3.0 p.b.w. of pure product which melted at 151° C., solidified again and showed a second sharp melting point at 167° C.

Analysis: calculated C 44.62%, H 4.16%, N 11.57%. (242.27) found C 44.3%, H 4.2%, N 11.4%.

PREPARATION EXAMPLE 7

Stage 1: A mixture of 106 p.b.w. of isobutyryl chloride and 137 p.b.w. of methyl 3-methylcrotonate was added dropwise in the course of 2 hours at about 10° C. to 380 p.b.w. of aluminum trichloride in 350 p.b.v. of methylene chloride. The mixture was heated under reflux for 15 hours and, after cooling, decomposed on ice. After addition of further methylene chloride, the mixture was thoroughly stirred, and the organic phase was separated off, washed and dried. After concentrating the solvent, the residue was distilled in vacuo. Yield: 164 p.b.w. of 6-isopropyl-4-methyl-2-pyrone, boiling point 95° to 110° C./1 mm Hg.

Stage 2: 16 p.b.w. of hydroxylamine hydrochloride were dissolved in a mixture of 10 p.b.w. of water/100 p.b.w. of methanol, and 36.8 p.b.w. of the product described above were added. After stirring for 2 hours at room temperature, 20 p.b.w. of sodium hydroxide in 30 p.b.w. of water were added to the solution, stirring was continued for 1 hour, 200 p.b.w. of water were added, and the solution was extracted with methylene chloride. The aqueous phase was then adjusted to pH 4 and the precipitated product (1-hydroxy-6-isopropyl-4-methyl-2-pyridone) was filtered off with suction and dried.

Stage 3: A solution of 2.8 p.b.w. of triethylamine in 30 p.b.v. of methylene chloride was slowly added with stirring to a solution, cooled to 5° C., of 4.0 p.b.w. of the compound described above and 3.45 p.b.w. of methanesulfonyl chloride in 50 p.b.v. of methylene chloride, in such a way that the preset temperature remained constant. The mixture was heated to room temperature and stirred for 35 hours. The organic phase was then washed with water, dried and concentrated. This gave 6.2 p.b.w. of a crude product having a melting point of about 110° C. This was dissolved in methylene chloride and chromatographed over a silica gel column with methylene chloride as the solvent. The fractions obtained were concentrated, giving 4.9 p.b.w. of 6-isopropyl-1-methanesulfonyloxy-4-methyl-2-pyridone. Recrystallization from diisopropyl ether give 3.9 p.b.w. of product which melted at 113° C.

Analysis: calculated C 48.96%, H 6.16%, N 5.71%. (245.31) found C 49.2%, H 6.3%, N 5.6%.

PREPARATION EXAMPLE 8

1st Stage: 108 p.b.w. of triethyl phosphite were slowly added dropwise with stirring at 100° C. in a distillation apparatus to 79.3 p.b.w. of 6-chloromethyl-4-methyl-2-pyrone (see Preparation Example 1, 2nd Stage). At this stage, ethyl chloride distilled over into the receiver. When the elimination of ethyl chloride subsided, the bath temperature was slowly increased to 130° C. and the mixture was stirred for about a further 6 hours at this temperature. After this time, a further 320 p.b.w. of 6-chloromethyl-4-methyl-2-pyrone were added to the mixture, and 432 p.b.w. of triethyl phosphite were slowly added dropwise at a bath temperature of 140° C. The mixture was again stirred at this temperature for a further 9 hours. After cooling, volatile constituents of the mixture were then subsequently distilled off in the course of about 3 hours at 70° C. in the vacuum of an oil pump. 610 p.b.w. of 6-diethoxyphosphorylmethyl-4-methyl-2-pyrone remained as a viscous residue, which started to crystallize after some time.

2nd Stage: 7.75 p.b.w. of sodium hydride (80% suspension) were added under inert gas and with intensive stirring to a mixture of 45.5 p.b.w. of benzophenone, 65 p.b.w. of the compound described above and 200 p.b.v. of 1,2-dimethoxyethane, and the mixture was stirred for 24 hours at 70° C. The mixture was taken up in methylene chloride, washed several times with water, dried and concentrated in a rotary evaporator. This gave 74.3 p.b.w. of a crude product which contained two components and was separated over a silica gel column with methylene chloride as the solvent. The fractions containing the product with the higher retention time were combined and concentrated. This gave 55 p.b.w. of crystalline 6-(2,2-diphenylvinyl)-4-methyl-2-pyrone, which can be recrystallized from hexane.

3rd Stage: 20 p.b.w. of the product described above were heated with 5.6 p.b.w. of hydroxylamine hydrochloride and 80 p.b.w. of aminopyridine to about 75° C. The mixture was left at this temperature for 58 hours, a further 2.8 p.b.w. of hydroxylamine hydrochloride being added each time after 6, 22 and 32 hours. After the mixture had cooled down, it was taken up in methylene chloride and washed with dilute hydrochloric acid and water, dried and concentrated. The resulting residue, 22 p.b.w., was recrystallized from acetonitrile. This gave 14 p.b.w. of a yellow product [6-(2,2-diphenylvinyl)-1-hydroxy-4-methyl-2-pyridone] having a melting point of 169° C.

Analysis: calculated C 79.18%, H 5.65%, N 4.62%. (303.26) found C 79.0%, H 5.8%, N 4.5%.

4th Stage: 3 p.b.w. of triethylamine in 20 p.b.v. of methylene chloride were added dropwise at 5° to 10° C. to a solution of 8 p.b.w. of the product described above and 3.5 p.b.w. of methanesulfonyl chloride in 70 p.b.v. of methylene chloride. The mixture was stirred for a further 24 hours at room temperature, extracted with water by shaking and the solvent was removed in a rotary evaporator. The viscous residue amounting to about 12.5 p.b.w. crystallized when left to stand and had a melting point of about 130° C. The crude product was eluted with methylene chloride over a silica gel column. After concentrating, the combined product fractions gave 8.2 p.b.w. of 6-(2,2-diphenyl-vinyl)-1-methanesulfonyloxy-4-methyl-2-pyridone having a melting point of 140° C.

Analysis: calculated C 66.12%, H 5.02%, N 3.67%.
(381.44) found C 65.7%, H 5.1%, N 3.4%.

PREPARATION EXAMPLE 9

Stage 1: 85 p.b.w. of (4-methyl-6-oxo-6H-pyron-2-yl-methyl)-triphenyl-phosphonium chloride (see Preparation Example 1, 3rd Stage) and 41.2 p.b.w. of anthracene-9-carbaldehyde were dispersed in 200 p.b.v. of methanol. A solution of 5 p.b.w. of sodium in 100 p.b.v. of methanol was added fairly rapidly with stirring to the dispersion, the mixture warming up. This was stirred for 1 hour at about 50° C. and then for a further 72 hours at room temperature, subsequently cooled down to −25° C., and the precipitated product was filtered off with suction. The product was washed with methanol, then stirred with water and again filtered off with suction. This gave 52 p.b.w. of 6-(2-anthracene-9-yl-vinyl)-4-methyl-2-pyrone having a melting point of about 200° C., which showed a melting point of 203° C. when recrystallized from acetonitrile.

Stage 2: 20 p.b.w. of the pyrone described above were heated to 70° C. with 5.6 p.b.w. of hydroxylamine hydrochloride and 80 p.b.w. of 2-aminopyridine. The mixture was left for 72 hours at this temperature, a further 2.8 p.b.w. of hydroxylamine hydrochloride being added each time after 7, 23 and 32 hours. After the mixture had cooled down, it was taken up in methylene chloride and washed with dilute hydrochloric acid and water. A part of the product thus precipitated. The organic phase was concentrated in a rotary evaporator. The residue was recrystallized from dimethylformamide (DMF). The crystals obtained were, together with the precipitated product, again recrystallized from DMF and washed with methanol. This gave 12.6 p.b.w. of an analytically pure orange-colored powder [6-(2-anthracene-9-yl-vinyl)-1-hydroxy-4-methyl-2-pyridone] which had a melting point of >260° C.

Analysis: calculated C 80.71%, H 5.24%, N 4.28%.
(327.39) found C 80.9%, H 5.4%, N 4.3%.

3rd Stage: 4.5 p.b.w. of the compound described above and 1.83 p.b.w. of methanesulfonyl chloride were dissolved in 50 p.b.v. of methylene chloride, and the solution was cooled to 5° C. A mixture of 1.6 p.b.w. of triethylamine in 20 p.b.v. of methylene chloride was slowly added dropwise to the solution. The mixture was stirred for a further 3 days at room temperature. The organic phase was washed with water and dried, and the solvent was stripped off in a rotary evaporator. The residue was again taken up in methylene chloride and eluted over a silica gel column with methylene chloride as the solvent. The clearly identifiable main fraction was collected and freed of solvent, and the remaining foam-like product was stirred with warm diisopropyl ether. After drying, this gave 1.9 p.b.w. of 6-(2-anthracene-9-yl-vinyl)-1-methanesulfonyloxy-4-methyl-2-pyridone which decomposed at a temperature of 180° C. with deflagration.

Analysis: calculated C 68.13%, H 4.72%, N 3.46%.
(405.48) found C 68.1%, H 4.9%, N 3.3%.

PREPARATION EXAMPLE 10

Stage 1: 26 p.b.w. of 6-diethoxyphosphorylmethyl-4-methyl-2-pyrone (see Preparation Example 2, 1st Stage) and 17.4 p.b.w. of 4-trifluoromethylbenzaldehyde were dissolved in 80 p.b.v. of 1,2-dimethoxyethane. Under nitrogen, 3.2 p.b.w. of an 80% sodium hydride dispersion were then added in portions in such a way that the reaction mixture did not heat up to more than 50° C. It was stirred for a further 18 hours at this temperature and, after cooling, diluted with methylene chloride. The solution was washed several times with water, dried and concentrated. 26.9 p.b.w. of a crystalline powder remained which was eluted over a silica gel column with methylene chloride as the solvent. After concentrating, the main fraction gave 18.9 p.b.w. of a powder of melting point 155° C., which proved to be the desired analytically pure 4-methyl-6-(4-trifluoromethyl-styryl)-2-pyrone.

Stage 2: 15 p.b.w. of the product described above, 45 p.b.w. of imidazole, 5 p.b.w. of N-methylpyrrolidone and 5.6 p.b.w. of hydroxylamine hydrochloride were heated for 55 hours at 75° C. with stirring. A further 2.8 p.b.w. of hydroxylamine hydrochloride were added each time after 8, 24 and 32 hours, reaction time. After the mixture had cooled down, it was taken up in methylene chloride, washed with water, dried and concentrated. This gave 14.6 p.b.w. of a crude product which was recrystallized from ethylene glycol monomethyl ether. The 1-hydroxy-4-methyl-6-(4-trifluoromethyl-styryl)-2-pyridone which had crystallized out showed a melting point of 230° C.

Analysis: calculated C 61.02%, H 4.10%, F 19.30%, N 4.74%.
(295.28) found C 61.3%, H 4.1%.

Stage 3: 1.8 p.b.w. of the compound described above and 1.9 p.b.w. of 4-bromobenzenesulfonyl chloride were dissolved in 40 p.b.v. of methylene chloride and the solution was cooled to 5° C. A mixture of 1.0 p.b.w. of triethylamine in 5 p.b.v. of methylene chloride was slowly added dropwise to the solution. Stirring was continued for a further 66 hours at room temperature. The organic phase was washed with water and dried, and the solvent was stripped off in a rotary evaporator. The residue (3.2 p.b.w.) was again taken up in methylene chloride and eluted over a silica gel column with methylene chloride/methanol (99/1) as the solvent. The clearly identifiable main fraction was collected and freed of solvent, and the remaining foam-like product was stirred with warm diisopropyl ether, crystallization of the product taking place. After drying, this gave 2.2 p.b.w. of 1-(4-bromobenzenesulfonyloxy)-4-methyl-6-(4-trifluoromethyl-styryl)-2-pyridone which melted at a temperature of 158° C.

Analysis: calculated C 49.04%, H 2.94%, N 2.72%, F 11.08%.
(514.33) found C 48.6%, H 3.1%, N 2.7%.

Other suitable 1-sulfonyloxy-2-pyridones which can be used in the present invention are discussed in Attorney Docket No. 16878/449, corresponding to German Patent Application P 41 12 966.0, filed concomitantly, which is hereby incorporated by reference in its entirety.

APPLICATION EXAMPLES

Examples 1 to 16 demonstrate the suitability of the mixture according to the invention for recording materials in microlithography, using radiation of very different energies. The superiority of the mixtures according to the invention over the state of the art is demonstrated by reference to Comparison Examples 17 and 18. Examples 19 and 20 document the applicability of the mixture in printed circuits and planographic printing plates.

EXAMPLE 1

A coating solution was prepared from 7.5 p.b.w. of a cresol-formaldehyde novolak having a softening range from 105° to 120° C., 2.0 p.b.w. of a cresol/formaldehyde resol (Bakelite R5363) and 0.5 p.b.w. of 6-(4-chloro-styryl)-1-methanesulfonyloxy-4-methyl-2-pyridone in 42 p.b.w. of propylene glycol monomethyl ether-acetate.

The solution was filtered through a filter of 0.2 μm pore diameter and whirler-coated at 3,000 rpm onto a wafer treated with an adhesion promoter (hexamethyldisilazane). After drying at 100° C. for 1 minute on a hotplate, the layer thickness was 1.05 μm.

The recording material was exposed imagewise under an original to the UV radiation (365 nm) of a xenon-mercury vapor lamp at an energy of 60 mJ/cm$^2$. The wafer was subsequently stored for 5 min at room temperature and then heat-treated at 100° C. for 2 minutes on a hotplate.

The recording material was developed with a 0.3N alkaline developer of the following composition:

5.3 p.b.w. of sodium metasilicate x 9H$_2$O, 3.4 p.b.w. of trisodium phosphate x 12 H$_2$O, 0.3 p.b.w. of sodium dihydrogen phosphate and 191 p.b.w. of deionized water.

After a developing time of 60 seconds, this gave a defect-free negative image of the mask with steep resist flanks, structures of <0.6 μm also being resolved in true detail. An examination of the flanks of the resist profiles by means of scanning electron microscopy proved that these were aligned virtually perpendicular to the substrate surface.

EXAMPLE 2

A coating solution was prepared from 7.5 p.b.w. of a copolymer of styrene/p-hydroxystyrene (molar ratio 20:80) having a mean molecular weight of 32,000, 2.0 p.b.w. of hexa-N-methoxymethylmelamine, and 0.7 p.b.w. of 1-(4-fluoro-benzenesulfonyloxy)-3,4,6-tri-methyl-2-pyridone in 42 p.b.w. of propylene glycol monomethyl ether-acetate.

The solution was filtered through a filter of 0.2 μm pore diameter and whirler-coated at 3,000 rpm onto a wafer treated with an adhesion promoter (hexamethyldisilazane). After drying for 1 minute at 100° C. on the hotplate, the layer thickness was 1.06 μm.

The recording material was exposed imagewise under an original with a xenon-mercury vapor lamp, using an interference filter, to radiation of 248±10 nm and an energy of 55 mJ/cm$^2$, stored briefly, subsequently heated for 2 minutes to 105° C. and then processed using the developer described in Example 1.

After a developing time of 120 seconds, this gave a defect-free negative image of the mask with high flank stability, structures of <0.5 μm being resolved here too in true detail.

EXAMPLE 3

A wafer produced corresponding to Example 1 was irradiated using the same quantity of 6-(4-chlorostyryl)-1-methanesulfonyloxy-4-methyl-2-pyridone under an original with UV light of a wavelength of 405 nm at an energy of 85 mJ/cm$^2$. After heat treatment and development, a negative image true to the original was obtained.

EXAMPLE 4

The experiment of Example 3 was repeated, but UV light of a wavelength of 436 nm was used. An exposure energy of 125 mJ/cm$^2$ was necessary to obtain a negative sharp-edged image of the original.

EXAMPLE 5

A coating solution was prepared from 7.5 p.b.w. of a homopolymer of 4-hydroxystyrene having a molecular weight of 18,000 and a softening range from 165° to 175° C.

2.0 p.b.w. of 4,4'-bis-methoxymethyldiphenyl ether and 0.6 p.b.w. of 1-(4-chloro-benzenesulfonyloxy)-4,5-diphenyl-2-pyridone in 42 p.b.w. of propylene glycolmonomethyl ether-acetate.

The solution was filtered through a filter of 0.2 μm pore diameter and whirler-coated at 3,400 rpm onto a wafer treated with an adhesion promoter (hexamethyldisilazane). After drying at 100° C. for 1 minute on the hotplate, the layer thickness was 0.95 μm.

The recording material was exposed imagewise under an original with a xenon-mercury vapor lamp, using an interference filter, to radiation of 248±10 nm and an energy of 55 mJ/cm$^2$ The material was stored for 5 minutes at room temperature and then heated for 2 minutes to 115° C. to complete the reaction.

The recording material was developed using 0.02N aqueous tetramethylammonium hydroxide solution, the exposed areas being detached without residue within 60 seconds.

Once more, a defect-free negative image of the mask with steep resist flanks was obtained. The loss in the exposed areas was <10 nm; even structures of <0.5 μm were resolved in true detail.

EXAMPLE 6

A coating solution was prepared from 7.5 p b w. of a 1:1 copolymer of styrene and maleimide, having a softening range from 165° to 180° C., 2.0 p.b.w. of hexa-acetoxymethylmelamine, 0.8 p.b.w. of 6-cyclohexyl-1-methanesulfonyloxy-4-methyl-3-nitro-2-pyridone in 42 p.b.w. of propylene glycol monomethyl ether-acetate.

The solution was filtered through a filter of 0.2 μm pore diameter and whirler-coated at 3,500 rpm onto a wafer treated with an adhesion promoter (hexamethyldisilazane). After drying for 1 minute at 100° C. on the hotplate, the layer thickness was 1.05 μm.

The recording material was exposed imagewise under an original with a xenon-mercury vapor lamp, using an interference filter, to radiation of 248±10 nm and an energy of 60 mJ/cm$^2$, and heat-treated as described in the preceding example.

The recording material was developed using 0.02N aqueous tetramethylammonium hydroxide solution, the unexposed areas being detached without residue within 60 seconds, giving a negative image of the original in true detail. The edge steepness of the image was outstanding.

EXAMPLE 7

A coating solution was prepared from 7.5 p.b.w. of a cresol/formaldehyde novolak having a softening range from 105° to 120° C., 2.0 p.b.w. of a cresol/formaldehyde resol (Bakelite R5363) and 0.7 p.b.w. of 1-(4-bromo-benzenesulfonyloxy)-4-methyl-6-(4-trifluoromethyl-styryl)-2-pyridone in 42 p.b.w. of propylene glycol monomethyl ether-acetate.

The solution was filtered through a filter of 0.2 μm pore diameter and whirler-coated at 3,000 rpm onto a wafer treated with an adhesion promoter (hexamethyldisilazane). After drying for 1 minute at 100° C. on the hotplate, the layer thickness was 1.00 μm. The recording material was exposed imagewise under an original to the UV radiation of a xenon-mercury vapor lamp at 365 nm at an energy of 65 mJ/cm$^2$, then stored for 5 minutes at room temperature and subsequently heated for 90 seconds to 115° C.

The recording material was developed using the developer described in Example 1.

After a developing time of 90 seconds, a negative, defect-free image of the mask with steep, substantially vertical resist flanks was again obtained, structures of <0.6 μm also being resolved in true detail.

EXAMPLE 8

A coating solution was prepared from 7.5 p.b.w. of a styrene/p-hydroxystyrene copolymer (molar ratio 20:80) having a mean molecular weight of 32,000, 2.0 p.b.w. of hexa-N-methoxymethylmelamine and 0.7 p.b.w. of 6-(2-anthracen-9-yl-vinyl)-1-methanesulfonyloxy-4-methyl-2-pyridone in 42 p.b.w. of propylene glycol monomethyl ether-acetate.

The solution was filtered through a filter of 0.2 μm pore diameter and whirler-coated at 3,100 rpm onto a wafer treated with an adhesion promoter (hexamethyldisilazane). After drying for 1 minute at 100° C. on the hotplate, the layer thickness was 1.1 μm.

The recording material was exposed imagewise under an original with a xenon-mercury vapor lamp, using an interference filter, to radiation of 248±10 nm and an energy of 35 mJ/cm$^2$, stored as described in the preceding example, heat-treated and then processed using the developer described in Example 1.

After a developing time of 120 seconds, a negative defect-free image of the mask with high flank stability was obtained, structures of <0.5 μm here again being resolved in true detail.

EXAMPLES 9 to 11

The recording material described in Example 8 was exposed to radiation of a wavelength of 365, 405 and 436 nm, respectively, dosages of 42, 55 and 60 mJ/cm$^2$, respectively, being necessary for a qualitatively perfect reproduction of the test structures down to 0.7 μm.

EXAMPLE 12

A wafer, coated according to Example 8, was irradiated under an original with UV light from a KrF excimer laser of a wavelength of 248 nm with an energy of 40 mJ/cm$^2$ The wafer was then stored for 15 minutes at room temperature and heated on the hotplate for about 45 seconds to 110° C. After development, a negative image true to the original was obtained similarly to Example 8, structures in the sub-micron range also being reproduced in true detail.

EXAMPLE 13

The experiment of Example 7 was repeated, but UV light of a wavelength of 436 nm was used. An exposure energy of 95 mJ/cm$^2$ had to be used to obtain a negative, sharp-edged image of the original.

EXAMPLE 14

A coating solution was prepared from 7.5 p.b.w. of a homopolymer of 4-hydroxystyrene having a softening range from 170° to 180° C., 2.0 p.b.w. of diphenylsilanediol and 0.7 p.b.w. of 1-methanesulfonyloxy-3,5-bis-methoxymethyl-4,6-dimethyl-2-pyridone in 42 p.b.w. of propylene glycol monomethyl ether-acetate.

The solution was filtered through a filter of 0.2 μm pore diameter and whirler-coated at 3,200 rpm onto a wafer treated with an adhesion promoter (hexamethyldisilazane). After drying for 1 minute at 100° C. on the hotplate, the layer thickness was 1.1 μm.

The recording material was exposed imagewise under an original to the UV radiation of a xenon-mercury vapor lamp at 260 nm at an energy of 36 mJ/cm$^2$, stored at room temperature for 5 minutes and then heated to 105° C. for 2 minutes.

The recording material was developed using a 0.14N aqueous tetramethylammonium hydroxide solution, the unexposed areas being detached within 60 seconds without leaving a residue, while the exposed areas showed virtually no loss.

Once more, a defect-free negative image of the mask with satisfactorily steep resist flanks was obtained. According to measurement using a layer thickness-measuring instrument made by Rudolph, the loss in bright light was <8 nm; structures of <0.55 μm were also resolved in true detail.

EXAMPLE 15

A coating solution was prepared from 7.5 p.b.w. of a homopolymer of 3-methyl-4-hydroxystyrene having a molecular weight of about 20,000 and a softening range from 145° to 155° C., 2.0 p.b.w. of 4,4'-bis-methoxymethyldiphenyl sulfone, 0.8 p.b.w. of 3-cyano-1-methanesulfonyloxy-4,6-dimethyl-2-pyridone in 42 p.b.w. of propylene glycol monomethyl ether-acetate.

The solution was filtered through a filter of 0.2 μm pore diameter and whirler-coated at 3,500 rpm onto a wafer treated with an adhesion promoter (hexamethyldisilazane). After drying for 1 minute at 100° C. on the hotplate, the layer thickness was 1.06 μm.

The recording material was exposed imagewise under an original with a xenon-mercury vapor lamp, using an interference filter, to radiation of 248±10 nm and an energy of 45 mJ/cm$^2$, and subsequently heat-treated as in Example 1.

The recording material was developed using a 0.27N aqueous tetramethylammonium hydroxide solution, the unexposed areas being detached within 60 seconds without leaving a residue and a negative image of the original in true detail being obtained. The edge steepness of the image was more than 88°.

EXAMPLE 16

The recording material from Example 7 was irradiated with synchrotron radiation (BESSY, Berlin, 754 MeV) through a gold-on-silicon mask at a dosage of 200 mJ/cm$^2$. The experimental assembly is described by A. Heuberger, Microelectr. Eng., 3, 535 (1985). The material was stored for about 10 minutes at room temperature and then heated to 110° C. for 2 minutes. After development using the developer described in Example 11 and a developing time of 70 seconds, this gave a defect-free negative image of the mask down to structures of <0.4 μm. The resist flanks were virtually perpendicular to the planar substrate surface.

EXAMPLES 17 and 18 (COMPARISON EXAMPLES)

The resist formulation of Example 14 was modified in such a way that the acid-generating compound used there was replaced by the same quantity of triphenylsulfonium hexafluorophosphate (Example 17) or 2-nitrobenzyl tosylate (Example 18). After exposure to radiation of a wavelength of 260 nm and an energy of 95 and 115 mJ/cm$^2$ respectively and heat-treatment and development using a developer of the composition indicated in Example 14, structures were obtained which showed no image differentiation suitable for practice.

When the onium salt was used (Example 17), coating residues were also observed in the unexposed areas, i.e., resist residues adhered to the substrate in the unexposed areas, whereas, when the tosyl ester was used (Example 18), undercut resist profiles were visible which were removable, even with enhanced exposure, only at the expense of the reproduction accuracy. Acceptable structurings were thus not obtainable in either case.

EXAMPLE 19

For producing an offset printing plate, a mechanically roughened and pretreated aluminum foil was whirler-coated with a coating solution of the following composition:
- 7.5 p.b.w. of a cresol/formaldehyde novolak having a softening range from 105° to 120° C.,
- 2.3 p.b.w. of a cresol/formaldehyde resol (Bakelite R5363),
- 0.5 p.b.w. of 6-(4-chlorostyryl)-1-methanesulfonyloxy-4-methyl-2-pyridone and
- 0.05 p.b.w. of crystal violet base in
- 90 p.b.w. of propylene glycolmonomethyl ether-acetate.

After drying, the layer (layer weight about 2.5 g/m$^2$) was exposed for 30 seconds under a negative test original and, after storage for 10 minutes, the plate was heated for 2 minutes in a circulating-air oven at a temperature of 115° C. Development was carried out using a developer of the following composition:
- 0.5 p.b.w. of sodium hydroxide,
- 0.8 p.b.w. of sodium metasilicate×9 H$_2$O and
- 1.0 p.b.w. of 2-n-butoxyethanol in
- 97.7 p.b.w. of deionized water.

On development, an inverse reproduction of the original in true detail became visible. After rinsing with water, the plate was made ready for printing by wiping with 1% phosphoric acid. After clamping into a printing press, 175,000 perfect prints were obtained.

EXAMPLE 20

The solution of a dry etch- and negative electroplating-resist was produced from the following composition:
- 12.5 p.b.w. of the novolak described in Example 16,
- 10.0 p.b.w. of hexa-N-methoxymethylmelamine
- 0.5 p.b.w. of 6-(2,2-diphenylvinyl)-1-methanesulfonyloxy-4-methyl-2-pyridone and
- 0.1 p.b.w. of crystal violet in
- 30 p.b.w. of butanone.

A 25 μm thick polyethylene terephthalate film usual for this purpose was coated with this solution to give a dry layer thickness of 18 μm. The surface of the dry resist film was laminated to a further polyethylene terephthalate film. After peeling off the cover film, the dry film was laminated under pressure and heat to a brass plate. After cooling and peeling off the support film, the plate was exposed through an original, good image contrast being visible after short heating. The material was stored for 10 minutes and then heated to 100° C. for 4 minutes. The unexposed areas were spray-developed using a developer of the composition indicated in Example 18. The plate was then etched through to the smooth flanks, using a commercially available iron(III) chloride solution. The milled products obtained can be yet further processed before they are separated.

What is claimed is:

1. A negative-working radiation-sensitive mixture comprising
    a) at least one compound which generates a strong acid under the action of actinic radiation,
    b) at least one compound having at least two groups cross-linkable by said strong acid and
    c) at least one polymeric binder which is insoluble in water and soluble or at least swellable in aqueous alkaline solutions,
wherein a) comprises a 1-sulfonyloxy-2-pyridone of the formula (I)

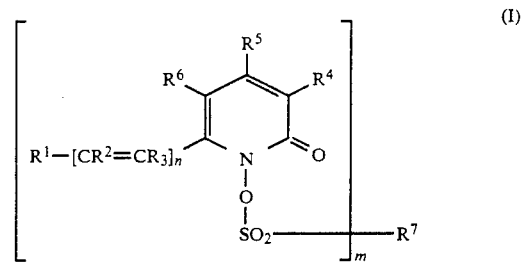

in which
R$^1$ is a hydrogen atom or an alkyl, cycloalkyl, aryl, aralkenyl, heteroaryl or heteroaralkenyl radical,
R$^2$ is hydrogen, chlorine, bromine or an alkyl, cycloalkyl, aryl or heteroaryl radical, or
R$^1$ and R$^2$ and together form a five- to eight-membered ring,
R$^3$ is hydrogen or an alkyl radical,
R$^4$ hydrogen, halogen, nitro, acylamino, cyano, thiocyanato or an alkyl, alkenyl, alkynyl, aryl, aralkyl, alkylthio, arylthio or cycloalkylthio radical,
R$^5$ is hydrogen or an alkyl or aryl radical or
R$^4$ and R$^5$ together form a five- to eight-membered ring,
R$^6$ is hydrogen, halogen, nitro, acylamino, cyano, thiocyanato or an alkyl, alkenyl, alkoxyalkyl, aryl, aralkyl, alkylthio, cycloalkylthio or arylthio radical, R⁷ is an alkyl, cycloalkyl, perfluorinated or highly fluorinated alkyl radical, aryl, arylalkyl, heteroaryl radical, alkylene, or arylene radical, m is 1 or 2, and n is 0, 1, 2 or 3.

2. A negative-working radiation-sensitive mixture as claimed in claim 1, wherein R¹ is an alkyl, cycloalkyl or heterocyclic radical, or an aryl radical of the formula II

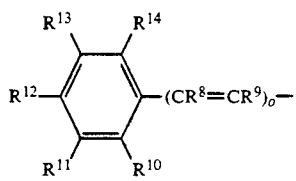

in which

R⁸ and R⁹ are identical or different and are hydrogen or an alkyl or aryl group, R¹⁰ to R¹⁴ are identical or different and are hydrogen, an alkyl, alkenyl, alkoxy, alkylthio or alkanesulfonyl radical each having up to 6 carbon atoms, a cycloalkyloxy, cycloalkylthio or cycloalkanesulfonyl radical each having up to 8 carbon atoms, a phenyl, styryl, phenoxy, phenylthio, benzenesulfonyl, phenylalkoxy, phenylalkylthio or phenylalkanesulfonyl radical which may be substituted on the aromatic ring and has up to 3 carbon atoms in the alkyl chain, hydroxyl, halogen, trifluoromethyl, nitro, cyano, alkoxycarbonyl, carbamoyl which may be substituted on the nitrogen by one or two alkyl radicals which alkyl radicals may be linked to form a 5- to 7-membered ring, sulfamoyl which may be substituted on the nitrogen by one or two alkyl radicals which alkyl radicals may be linked to form a 5- to 7-membered ring, alkanesulfonyloxy, arylsulfonyloxy, acylamino, alkylamino or arylamino, or two mutually adjacent substituents R¹⁰ to R¹⁴ form one or two further fused rings, and o is 0 or 1.

3. A negative-working radiation-sensitive mixture as claimed in claim 2, wherein R is a 5- or 6-membered heterocyclic ring having up to three heteroatoms, of the formula III

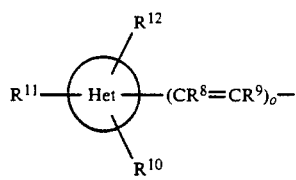

wherein R⁸ to R¹² and o are as defined in Formula II.

4. A negative-working radiation-sensitive mixture as claimed in claim 1, wherein R¹ is a ferrocenyl radical, R² is hydrogen, chlorine, bromine, alkyl, cycloalkyl or a radical of the formulae II

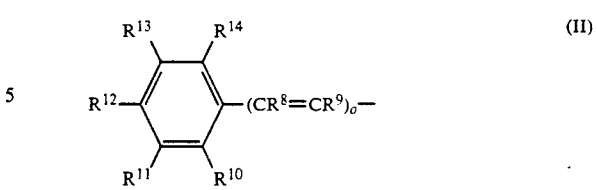

or formula III

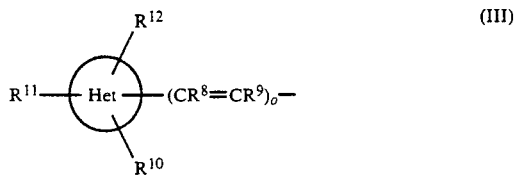

R⁸ and R⁹ are identical or different and are hydrogen or an alkyl or aryl group, R¹⁰ and R¹⁴ are identical or different and are hydrogen, an alkyl, alkenyl, alkoxy, alkylthio or alkanesulfonyl radical each having up to 6 carbon atoms, a cycloalkyloxy, cycloalkylthio or cycloalkanesulfonyl radical each having up to 8 carbon atoms, a phenyl, styryl, phenoxy, phenylthio, benzenesulfonyl, phenylalkoxy, phenylalkylthio or phenylalkanesulfonyl radical which may be substituted on the aromatic ring and has up to 3 carbon atoms in the alkyl chain, hydroxyl, halogen, trifluoromethyl, nitro, cyano, alkoxycarbonyl, carbamoyl which may be substituted on the nitrogen by one or two alkyl radicals which alkyl radicals may be linked to form a 5- to 7-membered ring, sulfamoyl which may be substituted on the nitrogen by one or two alkyl radicals which alkyl radicals may be linked to form a 5- to 7-membered ring, alkanesulfonyloxy, arylsulfonyloxy, acylamino, alkylamino or arylamino, or two mutually adjacent substituents R¹⁰ to R¹⁴ form one or two further fused rings, and o is 0 or 1, or R¹ and R² together form a five- to eight-membered ring, R³ is hydrogen or an alkyl radical, R⁴ is hydrogen, halogen, nitro, acylamino, cyano, thiocyanato or an alkyl, aryl, alkylthio, arylthio or cycloalkylthio radical, R⁵ is hydrogen or an alkyl or aryl radical or R⁴ and R⁵ together form a five- to eight-membered ring, is hydrogen, halogen, nitro, acylamino, cyano, thiocyanato or an alkyl, aryl, alkylthio, arylthio or cycloalkylthio radical, R⁷ is an alkyl or cycloalkyl radical, a perfluorinated or highly fluorinated alkyl radical or an aryl, arylalkyl, heteroaryl radical, alkylene or arylene radical and m is 1 or 2, and n is 0, l, 2 or 3.

5. A negative-working radiation-sensitive mixture as claimed in claim 1, wherein R⁷ is an alkyl radical having i to 4 carbon atoms, a highly fluorinated or perfluorinated alkyl radical having 1 to 4 carbon atoms or an aryl radical of the formula IV

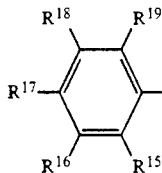 (IV)

in which $R^{15}$ and $R^{19}$ are identical or different and are hydrogen atoms or halogen atoms, alkyl radicals which have up to 6 carbon atoms and are unsubstituted or substituted by one or more of halogen atoms, aryl or aryloxy radicals, in which individual methylene groups can be replaced by one or more oxygen or sulfur atoms and in which in each case two of these radicals can be linked to form a 5- or 6-membered ring, cycloalkyl radicals having up to 8 carbon atoms, alkenyl radicals having up to 6 carbon atoms, or aryl or aryloxy radicals having up to 10 carbon atoms, the total number of the carbon atoms in the radicals $R^{15}$ to $R^{19}$ being not more than 12.

6. A negative-working radiation-sensitive mixture as claimed in claim wherein 1, wherein $R^7$ is a naphthyl or heteroaryl radical each having up to 10 carbon atoms, an alkylene radical having up to 6 carbon atoms or an arylene or heteroarylene radical each having up to 14 carbon atoms.

7. A negative-working radiation-sensitive mixture as claimed in claim 1, wherein
$R^2$, $R^3$, $R^4$ and $R^6$ are each hydrogen atoms,
$R^5$ is a methyl group,
$R^7$ is a methyl, ethyl, trifluoromethyl, 1,1,2,3,3,3-hexafluoropropyl, phenyl, tolyl, 4-fluorophenyl, 4-chlorophenyl, 4-bromophenyl, or 4-nitrophenyl radical,
m is 1, and
n is 0 or 1.

8. A negative-working radiation-sensitive mixture as claimed in claim 1, wherein the content of a) is 0.5 to 25% by weight, relative to the total weight of the solids in the radiation-sensitive mixture.

9. A negative-working radiation-sensitive mixture as claimed in claim i, wherein the extinction of c) for radiation of wavelength from about 220 to 500 nm is less than 0.5.

10. A negative-working radiation-sensitive mixture as claimed in claim 1, wherein c) comprises a polymer which contains at least one phenolic hydroxy group.

11. A negative-working radiation-sensitive mixture as claimed in claim 1, wherein c) contains at most 30% by weight of a novolak condensation resin.

12. A negative-working radiation-sensitive mixture as claimed in claim 1, wherein the content of c) is 30 to 95% by weight, relative to the total weight of the solids in the radiation-sensitive mixture.

13. A negative-working radiation-sensitive mixture as claimed in claim 1, wherein b) comprises a resol.

14. A negative-working radiation-sensitive mixture as claimed in claim wherein b) comprises an alkoxymethyl- or glycidyl-substituted aromatic compound or a melamine/formaldehyde or urea/formaldehyde condensate.

15. A negative-working radiation-sensitive mixture as claimed in claim wherein the 1-sulfonyloxy-2-pyridone has a higher molar absorption for radiation of the wavelength 220 to 500 nm than the remaining constituents of the mixture.

16. A negative-working radiation-sensitive recording material comprised of a support and a radiation-sensitive layer, wherein the layer comprises a radiation-curable mixture as claimed in claim 1.

17. A method of producing a recording material as claimed in claim 16, which comprises applying said radiation-sensitive layer to said support.

18. A method as claimed in claim 17, comprising dissolving said mixture in a solvent, and applying the resultant solution to said support, and optionally, removing said solvent.

19. A method of preparing an image pattern, comprising irradiating the radiation-sensitive layer of claim 16 imagewise, optionally heating the layer, treating the layer with a developer which removes or dissolves the unexposed areas of the layer, and optionally post-hardening the developed layer structures.

20. A method as claimed in claim 17, which comprises first applying said radiation-sensitive layer to a temporary support, and then applying said support to said radiation-sensitive layer, and then optionally removing said temporary support.

* * * * *

UNITED STATES PATENT AND TRADEMARK OFFICE
CERTIFICATE OF CORRECTION

PATENT NO. : 5,230,985
DATED : July 27, 1993
INVENTOR(S) : Gerhard LOHAUS ET AL.

It is certified that error appears in the above-indentified patent and that said Letters Patent is hereby corrected as shown below:

Column 29, line 50, Claim 3, delete "R" and insert --$R^1$--.

Column 30, line 54, Claim 4, after "ring," begins a new paragraph. Insert --$R^6$-- to begin the new paragraph.

Column 32, line 16, Claim 14, insert --1-- after "claim".

Column 32, line 20, Claim 15, insert --1-- after "claim".

Signed and Sealed this

Tenth Day of May, 1994

BRUCE LEHMAN

*Attest:*

*Attesting Officer*     Commissioner of Patents and Trademarks